United States Patent [19]
Chi et al.

[11] Patent Number: 6,060,742
[45] Date of Patent: May 9, 2000

[54] ETOX CELL HAVING BIPOLAR ELECTRON INJECTION FOR SUBSTRATE-HOT-ELECTRON PROGRAM

[75] Inventors: Min-hwa Chi, Hsinchu; Min-Chie Jung, Chi-Long, both of Taiwan

[73] Assignee: Worldwide Semiconductor Manufacturing Corporation, Hsinchu, Taiwan

[21] Appl. No.: 09/334,080

[22] Filed: Jun. 16, 1999

[51] Int. Cl.$^7$ .......................... H01L 29/76; G11C 14/00
[52] U.S. Cl. ........................................ 257/316; 257/548
[58] Field of Search ..................... 257/315, 316, 257/548, 314; 365/185.08, 185.11, 185.06

[56] References Cited

U.S. PATENT DOCUMENTS

| | | | |
|---|---|---|---|
| 5,457,652 | 10/1995 | Brahmbhatt | 365/185.06 |
| 5,822,243 | 10/1998 | Shone | 365/185.08 |
| 5,828,099 | 10/1998 | Van Dort et al. | 257/314 |
| 5,857,425 | 2/1999 | Wong | 365/185 |
| 5,917,751 | 6/1999 | Wakita | 365/185.11 |
| 5,929,478 | 7/1999 | Parris et al. | 257/314 |
| 6,011,293 | 1/2000 | Yazuriha et al. | 257/380 |

*Primary Examiner*—Donald L. Monin, Jr.
*Attorney, Agent, or Firm*—Blakely, Sokoloff, Taylor & Zafman, LLP

[57] ABSTRACT

An ETOX cell that has improved injection of electrons from a forward biased deep n-well to p-well junction underneath the channel area of a triple-well ETOX cell during substrate hot electron (SHE) programming. The ETOX cell has a control gate, a floating gate, a deep n-well formed in the substrate, a buried n+ layer in the deep n-well, a p-well formed in the n-well and atop the buried n+ layer, a drain implant formed in the p-well, and a source implant formed in the p-well. The buried n+ layer enhances the parasitic bipolar action between the n+ source/drain (as collector), the p-well (as base), and the buried n+ layer (as emitter). The parasitic transistor amplifies the amount of seed electrons injected into the p-well, which in turn results in significantly faster programming of the ETOX cell.

7 Claims, 4 Drawing Sheets

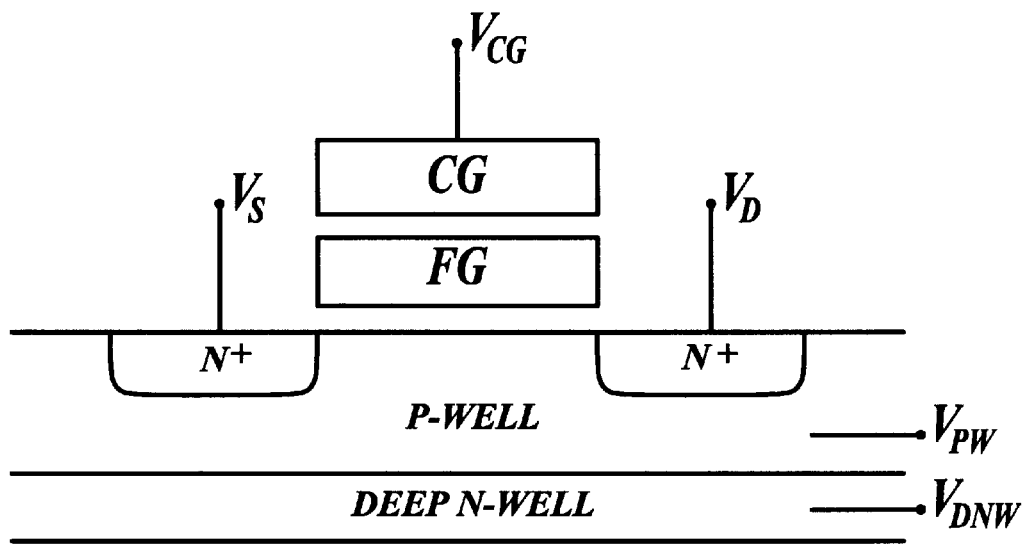
Fig. 1 *(PRIOR ART)*
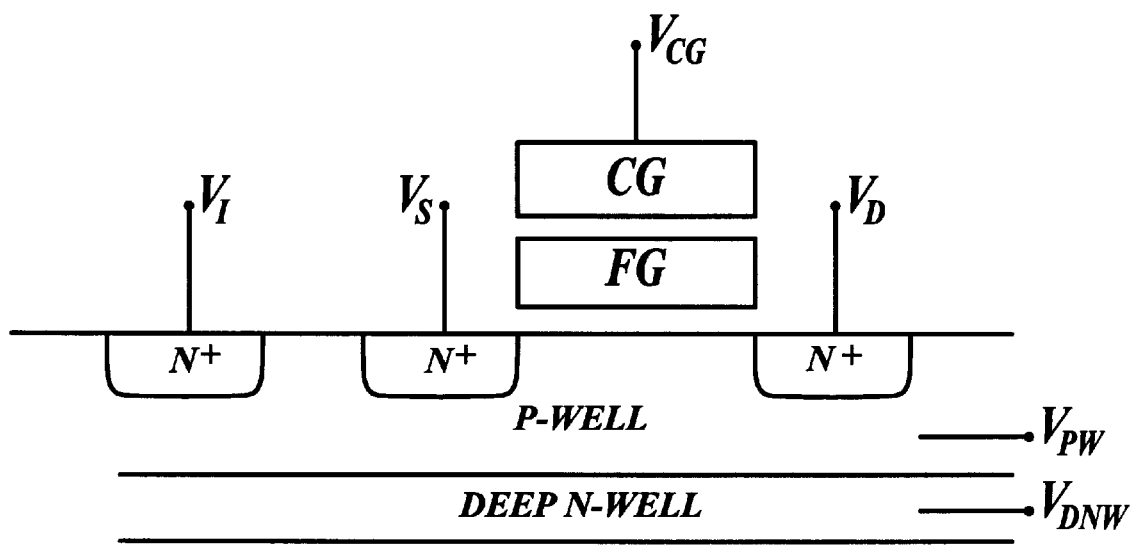
Fig. 2 *(PRIOR ART)*

ETOX CELL HAVING BIPOLAR ELECTRON INJECTION FOR SUBSTRATE-HOT-ELECTRON PROGRAM

FIELD OF THE INVENTION

The present invention relates to ETOX flash memory formed in triple wells, and more particularly, to an ETOX cell that includes a vertical bipolar transistor that allows enhanced electron injection for substrate hot-electron (SHE) programming.

BACKGROUND OF THE INVENTION

The stack-gate ETOX cell, one of the most popular cell structures for flash memories, is widely programmed by channel hot-electron (CHE) and erased by Fowler-Nordheim (FN) tunneling through the source side or the channel area.

The n-channel ETOX cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of ~1E16/$cm^2$ for the n+ junction) and $P^{31}$ (with a lower dose of ~1E14/$cm^2$ for the n-junction) so that the source junction can be biased at high voltage (e.g. ~12v) during erase operation. The n+ drain is typically implanted by As only with a high dose (~1E16/$cm^2$) and the drain side does not need the lightly-doped-drain (LDD) implant and spacer structure.

Note that the LDD structure is not useful in an ETOX cell, although it is important in normal CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX cell based on 0.35 um CMOS design rule has the following cell parameters: $T_{ox}$~90 angstroms, $T_{pp}$160 angstroms (oxide equivalent thickness), and control-gate to floating-gate coupling ratio of ~0.8.

The ETOX cell of FIG. 1 is typically programmed by channel-hot-electrons (CHE). The bias for programming is typically: $V_d$~7v, $V_{cg}$9–12v, and $V_s$=0v. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is typically erased by Fowler-Nordheim (F-N) tunneling through the source side or the channel area. The bias during source side erase is typically: $V_d$~0v or floating, $V_{cg}$~–5v to 0v, and $V_s$=+9 to +12v. This establishes a large electrical field (~10 Mv/cm) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d$~floating, $V_{cg}$~15v, $V_{pw}$~0v. A large electrical field (~10 Mv/cm) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high field during erase.

The read biases of the prior art ETOX cell are typically: $V_d$~1v to 2v, $V_{cg}$~$V_{cc}$, $V_s$~0v, $V_{pw}$~0v, $V_{dnw}$=Vcc, and $V_{sub}$~0v. The channel may be inverted or not depending on the net electron charge stored on the floating-gate, and results in the on and off of the cell as measured by the read current $I_{read}$ representing the digital information of "1" or "0" stored in the cell.

The prior art ETOX cell of FIG. 1 can be programmed by another method known as substrate-hot-electron (SHE) as shown in FIG. 2. As seen in FIG. 2, an additional n+ junction is needed (i.e., the "injection" junction) for injecting electrons through the forward-biased n+ injection junction to p-well junction. Unfortunately, most of the injected electrons are not diffused towards the channel area, but instead toward the nearby n+ source junction. Furthermore, the n+ source, p-well, and the n+ "injection" junction form a lateral npn bipolar transistor. The bipolar action of the npn bipolar transistor results in a large bipolar current at the node of n+ injection junction. Therefore, the SHE program scheme for the ETOX cell is not only very slow but also requires a large cell size due to the additional "injection" junction. As a result, this type of SHE programming scheme is not popular in commercial EPROMs or ETOX flash memories.

Another more recent SHE was reported in I. C. Chen, Kaya, and J. Paterson, "Band-to-band Tunneling Induced Substrate Hot-electron (BBISHE) Injection: A New Programming Mechanism for Nonvolatile Memory Devices," *Tech. Digest Intl.* Electron Devices Meetings, p. 263, 1989. The hot electrons are generated by the impact ionization of energetic holes, which are released by the band-to-band tunneling electrons in a deep depleted p-type island in the middle of the channel area of the EPROM cell. The injection efficiency is very high (relative to conventional SHE) by generating hot electrons close to the channel area. However, the cell size is large due to the heavily doped additional p-type island.

What is needed is an ETOX cell and method for efficiently programming the triple-well ETOX cell without increasing the size of the cell.

SUMMARY OF THE INVENTION

An ETOX cell formed from a triple-well process in a semiconductor substrate is disclosed. The ETOX cell comprises: a deep n-well formed within said substrate; a buried n+ layer formed within said deep n-well; a p-well formed within said deep n-well and atop said buried n+ layer; a floating gate formed above said p-well, said floating gate separated from said substrate by a thin oxide layer; a control gate formed above said floating gate, said floating gate and said control gate separated by a dielectric layer; a drain implant formed in said p-well and adjacent to a first edge of said floating gate; and a source implant formed in said p-well and adjacent to a second edge of said floating gate.

The buried n+ layer enhances the parasitic bipolar action between the n+ source/drain (as collector), the p-well (as base), and the buried n+ layer (as emitter). The parasitic npn transistor increases the amount of seed electrons injected into the p-well, which in turn causes significantly faster programming of the ETOX cell.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a schematic diagram of a prior art ETOX cell formed by a triple-well process;

FIG. 2 is a schematic diagram of a prior art ETOX cell using an injection junction;

DETAILED DESCRIPTION OF THE PREFERRED EMBODIMENT

Figure 3:
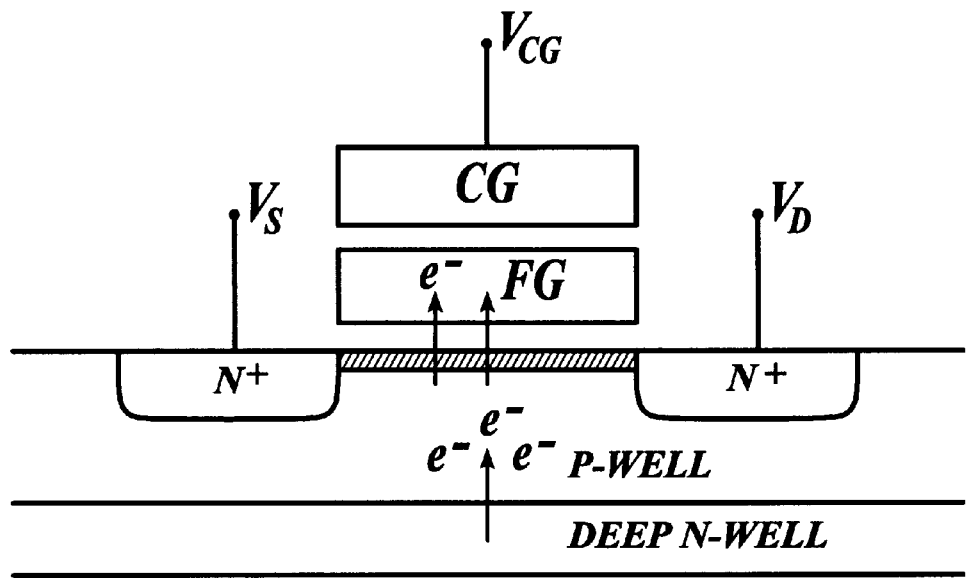
FIG. 3 is a schematic diagram of a triple-well ETOX cell during programming in accordance with the present invention.

The structure of a stack-gate ETOX cell in a triple-well is shown in FIG. 3. For an ETOX cell based on 0.35 um design rule, the following parameters are preferred: $T_{ox}=95A$, $T_{ono}=160A$, $\gamma_g=0.75$, $W=0.6$ um, $L=0.6$ um. $\gamma_g$ is the coupling ratio between the control gate and the floating gate.

The substrate hot electron (SHE) programming method of the present invention is qualitatively described first. The forward-biased deep n-well to p-well junction provides "seed" electrons (e.g. <1 uA/cell injecting and diffusing into the p-well. Preferably, the $V_{dnw}=0$ V and $V_{pw}=0.5$ volts. The control-gate is biased high enough (e.g., ~10v–13v) so that the channel is inverted. The source and drain junction are biased high enough (e.g., 5v to 7v) for accelerating (or heating up) those "seed" electrons toward the channel area and finally injecting the electrons onto the floating-gate. The control-gate potential ($V_{cg}$) establishes a field across the tunnel oxide for assisting hot electrons to inject toward the floating-gate.

Figure 4:
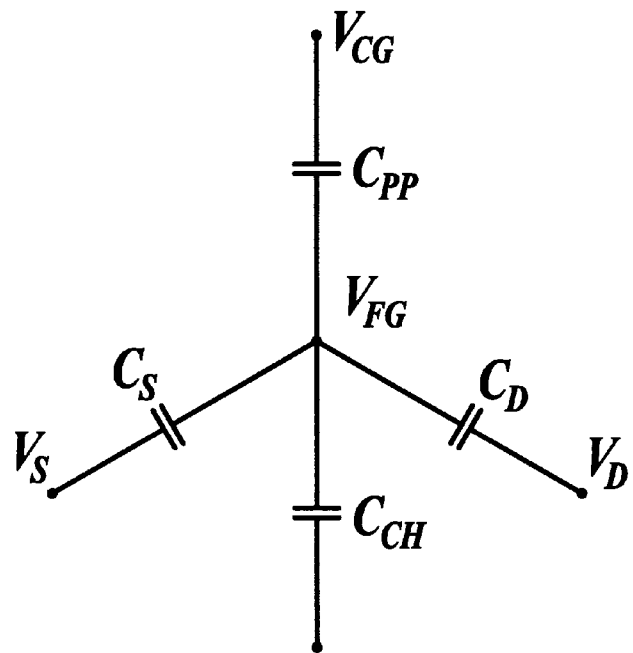
FIG. 4 is a schematic diagram of a lumped capacitor model of the ETOX cell of FIG. 3.

A simple analysis of SHE programming on ETOX cells is described here based on a lumped capacitor model of the ETOX cell shown in FIG. 4. The $V_{cg}$ can be estimated from charge conservation, $$C_{pp}(V_{fg}-V_{cg})+(C_s+C_d)(V_{fg}-V_d)+C_{ch}(V_{fg}-V_d)=Q_f \qquad (1)$$

Let $C_t=C_{pp}+C_s+C_d+C_{ch}$. The coupling ratios are defined as: $\gamma_g=C_{pp}/C_t$; $\gamma_d=C_d/C_t$; $\gamma_s=C_s/C_t$; $\gamma_{ch}=C_{ch}/C_t$; and $\gamma_g+\gamma_d+\gamma_s+\gamma_{ch}=1$. The programming bias conduction for a 0.35 um ETOX cell is: $V_{cg}=10v$ to 13v and $V_d=V_s=5v$ to 7v. The p-well is grounded for convenience. $V_{fg}$ is high enough, i.e., $V_{fg}>V_t$ (at bias of $V_d$) for channel inversion. The $V_{fg}$ during programming is from Eq. (1), $$V_{fg}=Q_f/C_t+V_{cg}\gamma_g+V_d(\gamma_d+\gamma_s+\gamma_{ch})=Q_f/C_t+V_{cg}\gamma_g+V_d(1-\gamma_g) \qquad (2)$$

During measurement of cell threshold voltage (i.e., $V_t\sim V_{to}/\gamma_g$), where $V_{to}$ is the threshold voltage viewed from the floating-gate: $V_d\sim 0.1v$, $V_s=0$, $V_{ch}\sim 0$, $V_{cg}=V_t$, $V_{fg}=V_{to}$, from Eq. (2), $$V_{to}=Q_f/C_t+(V_t-0.1)\gamma_g+0.1\cong Q_f/C_t+V_t\gamma_g \qquad (3)$$

At the beginning of programming, $Q_f\sim 0$, thus $V_t\cong V_{to}/\gamma_g$. As programming continues, $|Q_f|$ increases (i.e. more negative electron charge), and $V_{fg}$ decreases, until the $V_{fg}$ approaches a value of $V_d+V_{to@Vd}$ (i.e. the threshold-voltage viewed from floating-gate at body-bias of $V_d$), when the inversion is about to disappear. $V_{to@Vd}\sim V_{to}+\eta V_d$; where $\eta$ is the coefficient of the body-bias effect. Typically, $\eta\sim 0.15$. When the inversion layer is about to disappear, the programming process becomes slow and almost stops; the $V_{fg}$ stays constant, and $Q_f$ saturates (also $V_t$ saturates). Thus, from Eq. (2) and Eq. (3), $$V_t\gamma_g \cong V_{to} - Q_f/C_t \qquad (4)$$
$$\cong (V_{to} - V_d - V_{to(@Vd)}) + V_{cg}\gamma_g + V_d(1-\gamma_g)$$
$$\cong V_{cg}\gamma_g - V_d(\gamma_g + \eta)$$

Figure 5:
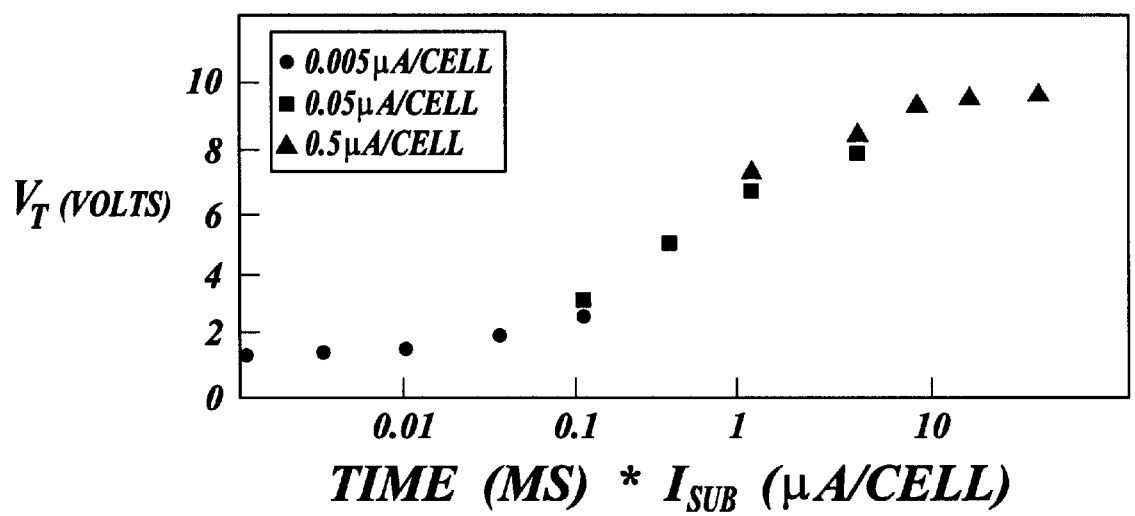
FIG. 5 is a graph is a universal programming curve for the programming method of the present invention.

Experimental programming curves on the ETOX cell of FIG. 3 have been obtained. The programming speed is related to the magnitude of $I_{sub}$ (for providing seed electrons), the bias of $V_d$ and $V_s$ (for heating up electrons), and the $V_{cg}$ (for channel inversion and assisting hot electrons to inject across the tunnel oxide). FIG. 5 shows a universal program curve at constant $V_{cg}$ (13 volts), $V_d$ (5 volts), and $V_s$ (5 volts) with $I_{sub}$*time as a parameter. The cell $V_t$ saturates for long programming times. Compared to channel hot electron methods, the total SHE programming current is reduced by ~100×.

In addition, it can be clearly seen that if more seed electrons are injected from the deep n-well to the p-well junction ($I_{sub}$), the programming may be made faster. Unfortunately, the injection of electrons from the deep n-well to p-well is poor due to the (approx. 10 times) lower doping level in the deep n-well than the doping level of the p-well. The electron injection is only a small fraction (<1%) of the total current between the deep n-well and p-well junction. Furthermore, there is negligible bipolar action from the vertical npn structure of the deep n-well (as emitter), p-well (as base), and n+ source/drain (as collector) together with the inverted channel.

Figure 6:
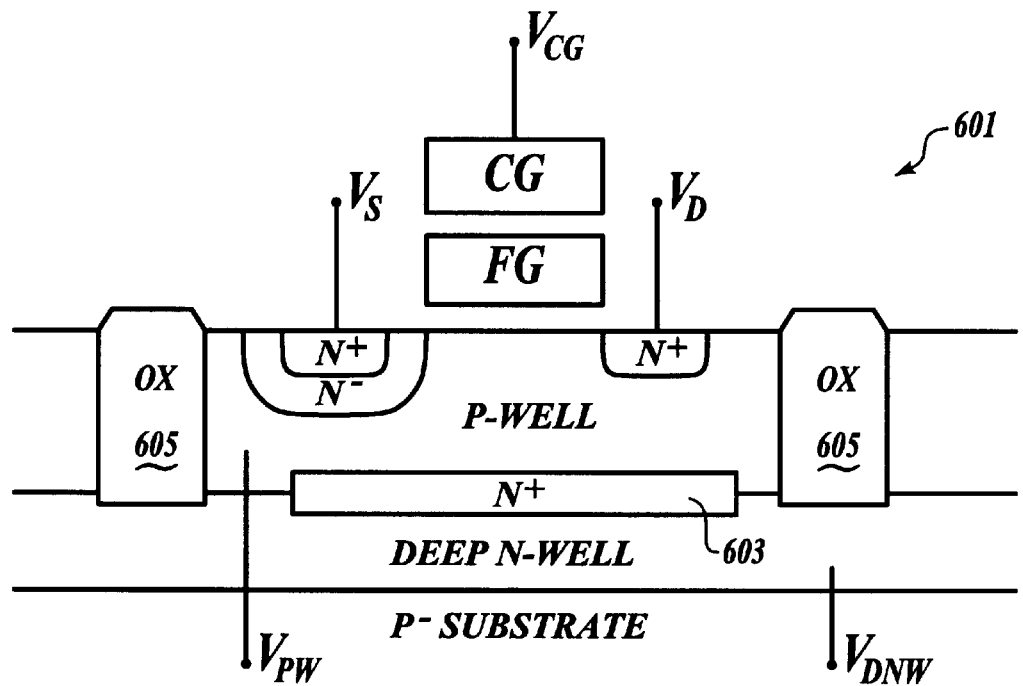
FIG. 6 is a schematic diagram of an ETOX cell formed in accordance with the present invention.

FIG. 6 shows a new structure of an ETOX cell 601 designed to increase the amount of injected electrons from the deep n-well by the use of a vertical bipolar transistor. The ETOX cell 601 has two additional features compared to the conventional ETOX cell shown in FIG. 1. First, a buried n+ layer 603 is formed underneath the p-well and above the deep n-well. Second, oxide trench isolations 605 are formed for isolating the p-well.

The buried n+ layer 603 can be easily formed by using an additional masking step (opening the cell area after the deep n-well is defined) and high energy ion implant of an n-type dopant (e.g. $P^{31}$). As will be seen with greater detail below, the implant process must be carefully designed to achieve three goals: (1) small base width (for larger gain), (2) higher emitter doping than the p-well doping (for high injection efficiency), and less total $P^{31}$ dose (for less damage by the high energy implant). The buried n+ layer 603 is preferably implemented by $P^{31}$ with multiple energies (500 Kev and 750 Kev) with doses of about 1E15 each on current triple-well 0.35 micron CMOS technology.

The trench isolations 605 preferably extend deeper than the p-well depth (approx. 1 micron). The trench isolations 605 can be formed by a masking step for a trench etch at the front end of the fabrication process. In comparison, typical shallow trench isolation structures for 0.35 micron CMOS transistor process extend only about 0.3–0.5 microns deep. Thus, trench isolations 605 for isolating p-wells can also be used as shallow trench isolation structures for CMOS transistors. The trench isolation technique will result in smaller spacing and is therefore preferred. In any case, the trench isolations 605 must be at least slightly deeper than the p-well depth.

The addition of the buried n+ layer 603 provides a bipolar action that injects electrons into the p-well. In particular, a parasitic npn structure is formed from the: (1) deep n-well and buried n+ layer (as emitter), (2) p-well (as base), and (3) n+ source/drain and inverted channel (as collector). The inverted channel connected with the n+ source/drain regions serve as the collector of the parasitic bipolar transistor. The buried n+ layer 603 has a higher doping level than the p-well and this results in high electron injection efficiency (e.g. $\alpha$ approximately 0.9) from the forward-biased buried n+ layer to the p-well.

Moreover, the common retrograded p-well doping profile from typical CMOS processes can provide additionally advantages of a built-in field for assisting electrons transiting through the base (b-well) toward the collector. A small p-well (base) current can induce a large collector current with the bipolar amplification factor $\beta$ (i.e. typically defined as $\beta=\alpha/(1-\alpha)$). This means that the majority of the total emitter current will flow toward the collector area as seed electrons for the SHE programming. This mechanism will result in much faster SHE programming compared to prior art ETOX cells.

Figure 7:
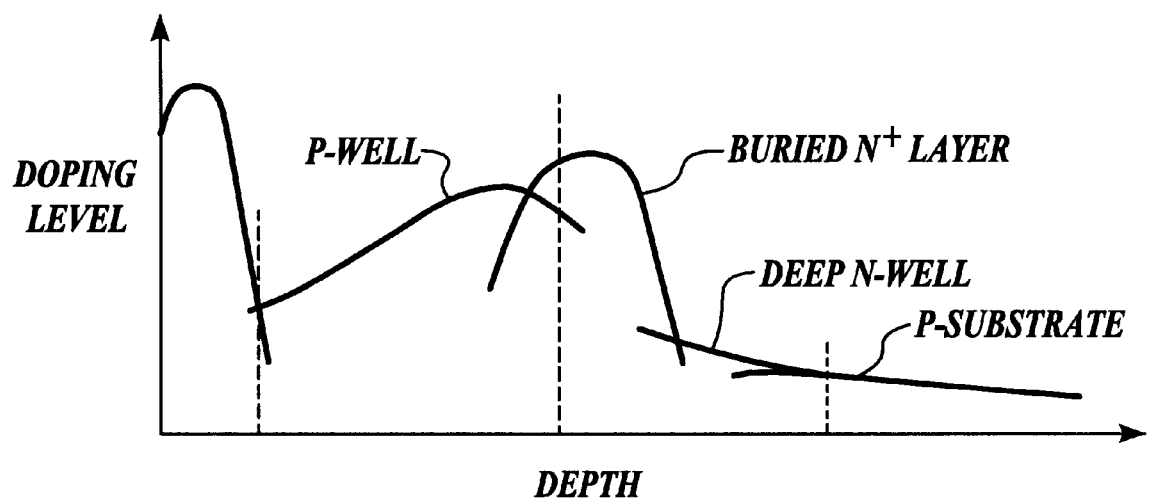
FIG. 7 is a qualitative graph of the vertical doping profile of the parasitic bipolar structure of the ETOX cell formed in accordance with the present invention.

The dose and energy of the buried n+ layer 603 will determine the position of the emitter junction and the $\beta$ of the bipolar action. The bipolar action can be maximized by higher electron injection efficiency (from the buried n+ layer to the p-well) as smaller base (p-well) width (in the vertical dimension). One preferred design is shown in FIG. 7, where the buried n+ layer is close to and with doping ten times higher than the peak doping level of the retrograded p-well (for good electron injection efficiency). The effective base width (e.g. <0.5 microns) is smaller than the p-well depth (approx. 1 micron) for increasing the $\beta$ of the parasitic bipolar. The retrograded p-well doping can result in a built-in field for assisting transiting through the base and further increasing $\beta$.

In accordance with the present invention, the electrons available for substrate hot electron injection from the bipolar action are at least three orders of magnitude higher than those from prior art substrate injection methods. This allows for very fast programming to be achieved at the same total current during programming.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An ETOX cell formed from a triple-well process in a semiconductor substrate, said ETOX cell comprising:

a deep n-well formed within said substrate;

a buried n+ layer formed within said deep n-well;

a p-well formed within said deep n-well and atop said buried n+ layer;

a floating gate formed above said p-well, said floating gate separated from said substrate by a thin oxide layer;

a control gate formed above said floating gate, said floating gate and said control gate separated by a dielectric layer;

a drain implant formed in said p-well and adjacent to a first edge of said floating gate; and a source implant formed in said p-well and adjacent to a second edge of said floating gate.

2. The cell of claim 1 wherein said buried n+ layer is formed using a high energy implanter so that the buried n+ layer has a higher dopant concentration than said p-well.

3. The cell of claim 1 wherein the cell is programmed by:

forward biasing said p-well relative to deep n-well;

positively biasing said control gate by a voltage sufficient to invert the channel between said source implant and said drain implant; and positively biasing said source and drain.

4. The cell of claim 3 wherein during programming said deep n-well is grounded and said p-well is positively biased.

5. The cell of claim 3 wherein during programming said control gate is biased to between 10 to 13 volts and said source implant and said drain implant is biased to between 5 to 7 volts.

6. The cell of claim 5 wherein during programming said deep n-well is grounded and said p-well is positively biased.

7. The cell of claim 1 further including a trench isolation structure surrounding said p-well and extending from the surface of said substrate to said deep n-well.

* * * * *